United States Patent
Elshaer et al.

(10) Patent No.: US 10,369,891 B2
(45) Date of Patent: Aug. 6, 2019

(54) WIRELESS POWER TRANSFER SYSTEM PARAMETER ESTIMATION

(71) Applicant: Ford Global Technologies, LLC, Dearborn, MI (US)

(72) Inventors: Mohamed Elshaer, Dearborn, MI (US); Chingchi Chen, Ann Arbor, MI (US); John Paul Gibeau, Canton, MI (US); Mark J. Ferrel, Brighton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 132 days.

(21) Appl. No.: 15/437,256

(22) Filed: Feb. 20, 2017

(65) Prior Publication Data
US 2018/0236879 A1    Aug. 23, 2018

(51) Int. Cl.
| | |
|---|---|
| H02J 7/02 | (2016.01) |
| B60L 11/18 | (2006.01) |
| H02J 50/12 | (2016.01) |
| H02J 50/90 | (2016.01) |
| G01R 31/00 | (2006.01) |
| B60L 53/22 | (2019.01) |
| B60L 53/12 | (2019.01) |
| H03H 7/38 | (2006.01) |

(52) U.S. Cl.
CPC ............ *B60L 11/182* (2013.01); *B60L 53/12* (2019.02); *B60L 53/22* (2019.02); *G01R 31/006* (2013.01); *H02J 7/025* (2013.01); *H02J 50/12* (2016.02); *H02J 50/90* (2016.02); *H03H 7/38* (2013.01); *Y02T 10/7005* (2013.01); *Y02T 10/7022* (2013.01); *Y02T 90/125* (2013.01)

(58) Field of Classification Search
CPC ........................................................ H02J 7/025
USPC ........................................................ 320/108
See application file for complete search history.

(56) References Cited

U.S. PATENT DOCUMENTS

| | | | |
|---|---|---|---|
| 8,569,994 B2 | 10/2013 | Dougherty | |
| 2013/0039099 A1 | 2/2013 | Wu et al. | |
| 2014/0172338 A1* | 6/2014 | Lafontaine | G01R 25/00 |
| | | | 702/65 |
| 2015/0280455 A1* | 10/2015 | Bosshard | H02J 5/005 |
| | | | 307/104 |

(Continued)

FOREIGN PATENT DOCUMENTS

WO    2016146795 A1    9/2016

OTHER PUBLICATIONS

Deepak Gautam et al. "An Automotive On-Board 3.3kW Battery Charger for PHEV Application." 978-1-61284-247-9/11. 2011 IEEE. 6 pages.

(Continued)

*Primary Examiner* — Edward Tso
*Assistant Examiner* — Ahmed H Omar
(74) *Attorney, Agent, or Firm* — David Kelley; Brooks Kushman, P.C.

(57) ABSTRACT

A vehicle is provided with a coil and a sensor. The coil is adapted to receive power wirelessly in single-phase form from an external coil. The sensor is adapted to measure a characteristic of the power. The vehicle is also provided with a controller that is programmed to estimate a parameter indicative of coil alignment using a three-phase representation of the power based on the characteristic, and to adjust the power received by the coil based on the parameter.

20 Claims, 10 Drawing Sheets

(56) References Cited

U.S. PATENT DOCUMENTS

2016/0268944 A1   9/2016  Xu et al.

OTHER PUBLICATIONS

Elie Ayoub et al. "Review on the Charging Techniques of a Li-ion Battery." ISBN: 978-1-4799-5680-7/15. 2015 IEEE, pp. 50-55.
Aristeidis Karalis et al. "Efficient Wireless Non-Radiative Mid-Range Energy Transfer." Anals of Physics 323 (2008) pp. 34-48.
Hiroya Takanashi et al. "A Large Air Gap 3 kW Wireless Power Transfer System for Electric Vehicles." 978-1-4673-0803-8/12. 2012 IEEE, pp. 269-274.
John M. Miller et al. "Primary-Side Power Flow Control of Wireless Power Transfer for Electric Vehicle Charging." IEEE Journal of Emerging and Selected Topics in Power Electronics, vol. 3, No. 1, Mar. 2015, pp. 147-162.
Mohamed Elshaer, "Integrated Wireless Transfer System," U.S. Appl. No. 15/404,853, filed Jan. 12, 2017.

\* cited by examiner

WIRELESS POWER TRANSFER SYSTEM PARAMETER ESTIMATION

TECHNICAL FIELD

One or more embodiments relate to a wireless power transfer system for an electrified vehicle.

BACKGROUND

Electrified vehicles, including battery electric vehicles (BEVs) and plug-in hybrid electric vehicles (PHEVs) may be connected to an external power supply by a wired connection for conductively charging a vehicle battery. Such vehicles typically include a charge cord that physically connects the external power supply to a vehicle charging port to facilitate charging of the vehicle battery. Alternatively, electrified vehicles may be wirelessly connected to an external power supply for inductively charging the vehicle battery. Such wireless charging is referred to as wireless power transfer.

SUMMARY

In one embodiment, a vehicle is provided with a coil and a sensor. The coil is adapted to receive power wirelessly in single-phase form from an external coil. The sensor is adapted to measure a characteristic of the power. The vehicle is also provided with a controller that is programmed to estimate a parameter indicative of coil alignment using a three-phase representation of the power based on the characteristic, and to adjust the power received by the coil based on the parameter.

In another embodiment, a power transfer system is provided with a coil, an inverter and a controller. The coil is adapted to receive power inductively from an external coil. The inverter is coupled to the external coil. The controller is programmed to adjust at least one of a switching frequency and a phase shift angle of the inverter based on coil alignment estimated using a three-phase representation of the power.

In yet another embodiment, a wireless power transfer (WPT) method is provided. Power is received wirelessly from an external source through coupled coils. A characteristic of the power is measured. A three-phase representation of the power is generated based on the measured characteristic. A parameter indicative of coil alignment is estimated using the three-phase representation. The power is adjusted based on the parameter.

As such, the WPT system estimates the coil parameters in real-time based on measured characteristics of the power using a three-phase representation of the power, and then adjusts the power based on the estimated coil parameters. Such an approach adjusts the transferred power in real-time to account for any changes in coil alignment during charging while accurately estimating coils' parameters without being influenced by the system dynamics.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
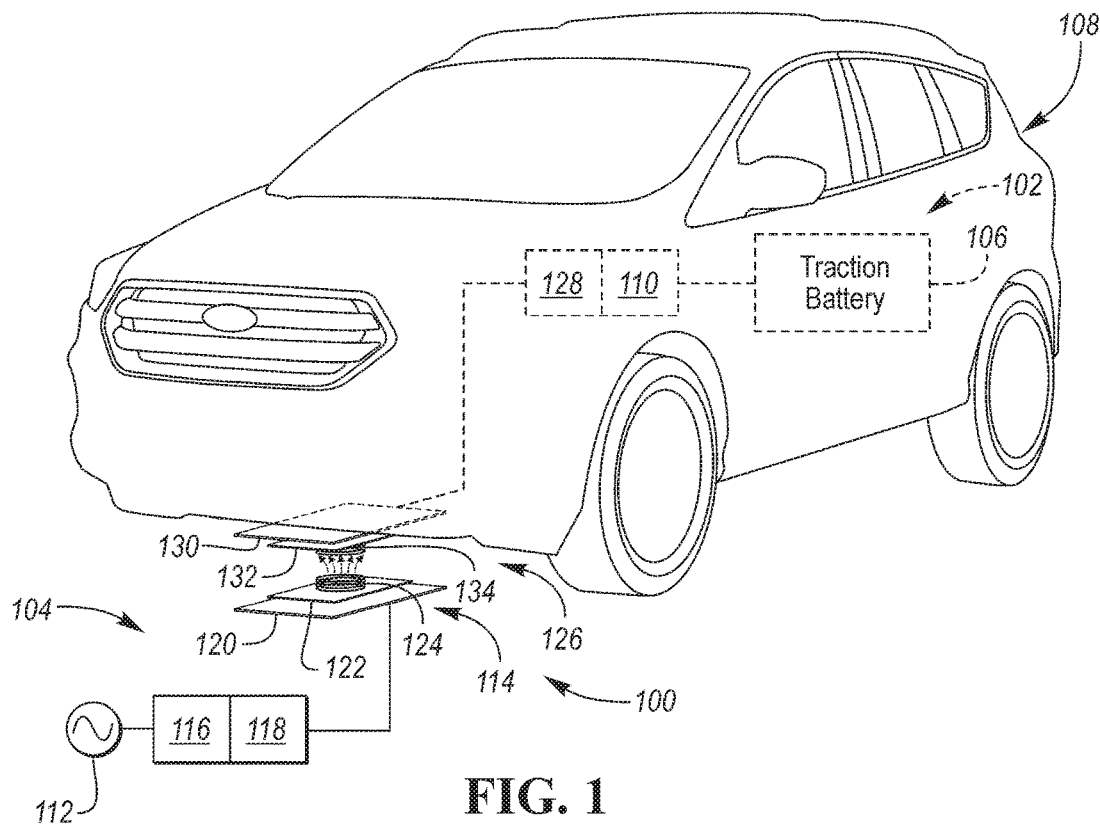
FIG. 1 is a schematic view of a wireless power transfer (WPT) system according to one or more embodiments and illustrated with a hybrid vehicle and an external power supply.

With reference to FIG. 1, a wireless power transfer (WPT) system is illustrated in accordance with one or more embodiments and generally referenced by numeral 100. The WPT system 100 includes a vehicle charging subsystem 102 and an external charging subsystem 104 that cooperate with each other to charge a traction battery 106 that is mounted within a vehicle 108. The vehicle charging subsystem 102 includes a controller 110 that receives charging system characteristic information that corresponds to an instantaneous position of the vehicle 108 relative to the external charging subsystem 104. The controller 110 estimates WPT parameters based on this information and adjusts components of the voltage and current of the WPT system based on these estimated parameters to optimize the efficiency of the power transfer.

The external charging subsystem 104 includes a power source 112 and a ground coil assembly 114. The power source 112 represents a conventional alternating current (AC) electrical power distribution network or grid as provided by an electric utility company, according to one or more embodiments. An external circuit 116 connects the power source 112 to the ground coil assembly 114, and includes components for conditioning (e.g., rectifying, inverting, converting and storing) the power signal that is provided to the ground coil assembly 114. The external charging subsystem 104 also includes an external controller 118 that monitors the power transferred to the vehicle 108 and communicates with the vehicle controller 110 to control the transferred power. The ground coil assembly 114 includes a plate 120 that is mounted to an underlying surface, e.g., a garage floor, and typically formed of aluminum. The ground coil assembly 114 also includes an inductor with a core 122 and a coil 124 (primary coil).

The vehicle charging subsystem 102 includes the traction battery 106 and a vehicle coil assembly 126. A vehicle charging circuit 128 connects the vehicle coil assembly 126 to the traction battery 106 and includes components for conditioning (e.g., rectifying and converting) the power that is provided to the traction battery 106. The controller 110 monitors the power received by the vehicle 108 and communicates with the external controller 118 to control the power. The vehicle coil assembly 126 includes a plate 130 that is mounted to an underside of the vehicle 108, and typically formed of aluminum. The vehicle coil assembly 126 also includes an inductor with a core 132 and a coil 134 (secondary coil).

The vehicle coil assembly 126 aligns with the ground coil assembly 114 for receiving electrical power. The power source 112 supplies the primary coil 124 with a current which establishes a magnetic field (not shown) about the primary coil 124. The secondary coil 134 may be electromagnetically coupled to the primary coil 124, by aligning the vehicle coil assembly 126 with the ground coil assembly 114, and placing the secondary coil 134 within the magnetic field. This magnetic field induces a current in the secondary coil 134 to wirelessly transfer power for inductively charging the traction battery 106. Inductive charging does not require physical contact between the coils 124, 134. However, the coils 124, 134 must be generally close in proximity to each other for efficient inductive charging.

Figure 2:
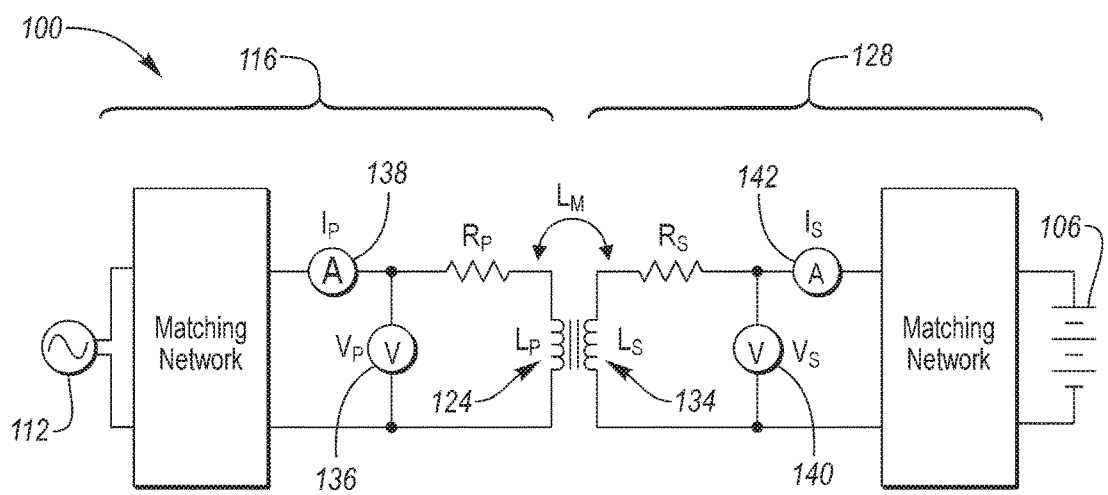
FIG. 2 is a circuit diagram further illustrating the WPT system of FIG. 1.

Referring to FIGS. 1 and 2, the vehicle controller 110 and the external controller 118 communicate with each other to control various aspects of the WPT system 100. The controllers 110, 118 communicate wirelessly, according to one embodiment, for example using radio-frequency (RF), infrared (IR) or sonar communication.

The vehicle controller 110 and the external controller 118 control various components of the voltage and current within the WPT system 100 (e.g., the frequency, phase shift angle and amplitude) based on coil parameters to optimize charging efficiency. The coil parameters include the self-inductance of the primary coil ($L_P$), the self-inductance of the secondary coil ($L_S$) and the magnetic mutual inductance ($L_M$) between the coils. The external plate 120 and core 122 affect the primary coil self-inductance ($L_P$), and the vehicle plate 130 and core 132 affect the secondary coil self-inductance ($L_S$). The magnetic mutual inductance ($L_M$) is higher when the coils 124, 134 are aligned with each other, than when they are misaligned. Any misalignment of the coil 124, 134, even by a few centimeters, may result is a significant change in the magnetic mutual inductance ($L_M$).

The WPT system 100 estimates the coil parameters ($L_S$, $L_P$ and M) based on voltage and current measurements. The external charging subsystem 104 includes a voltage sensor 136 for measuring the primary voltage ($V_P$) and a current sensor 138 for measuring the primary current ($I_P$) provided to the primary coil 124. Similarly, the vehicle charging subsystem 102 includes a voltage sensor 140 for measuring the secondary voltage ($V_S$) and a current sensor 142 for measuring the secondary current ($I_S$). The WPT system 100 estimates the coil parameters based on the voltage and current measurements using a direct-quadrature-zero (DQ) reference transformation. The DQ transformation rotates the reference frames of AC waveforms such that they become DC signals. Simplified calculations can then be carried out on these DC quantities before performing the inverse transform to recover the actual three-phase AC results. The DQ transformation is typically used with three-phase circuits, but the WPT system 100 modifies the approach to analyze the single-phase signal provided by the external charging subsystem 104.

The WPT system 100 estimates the coil parameters dynamically (i.e., in real-time) during charging. The coil-parameters are affected by the alignment of the coils 124, 134 and this alignment may change during charging. For example, a user may park a loaded vehicle 108 in their garage after shopping. Then after initiating inductive charging, the user may unload contents from the vehicle 108, which causes the vehicle body and secondary coil 134 to shift a few centimeters. This movement of the secondary coil 134 could adjust the coil parameters (e.g., M). The WPT system 100 detects this change in the coil parameters, and adjusts the charging characteristics accordingly, in real-time.

The external circuit 116 and the vehicle circuit 128 each include a matching network. The matching networks are used to adjust the frequency of the received signal to approximate the switching frequency, which creates magnetic resonance and allows the coils 124, 134 to transfer a significant amount of power at acceptable volt-amp levels.

Figure 3:
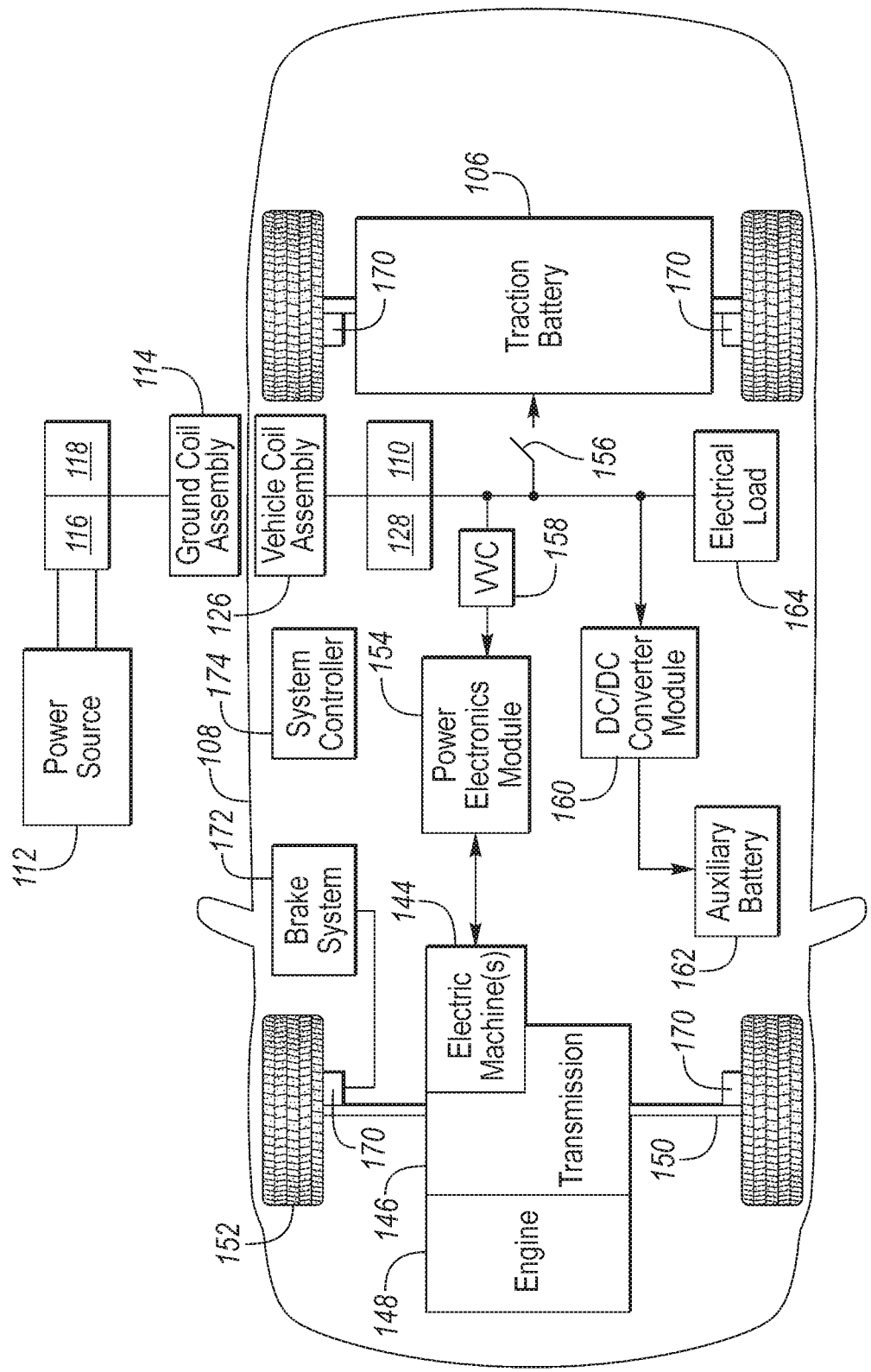
FIG. 3 is a diagram of the hybrid vehicle and the external power supply of FIG. 1, illustrating drivetrain and energy storage components.

FIG. 3 depicts the vehicle 108 as a hybrid-electric vehicle (HEV). An HEV 108 includes one or more electric machines 144 that mechanically couple to a hybrid transmission 146. The electric machines 144 are capable of operating as a motor or as a generator. In addition, the hybrid transmission 146 is mechanically coupled to an engine 148. The hybrid transmission 146 is also mechanically coupled to a drive shaft 150 that is mechanically coupled to the wheels 152. The electric machines 144 can provide propulsion and deceleration capability when the engine 148 is turned on or off. The electric machines 144 are controlled to act as generators to provide fuel economy benefits by recovering energy during regenerative braking that would normally be lost as heat in a friction braking system. The HEV 108 reduces vehicle emissions, as compared to a conventional vehicle, by operating the engine 148 when it is most efficient (e.g., at high engine torque and high engine speed) and operating the electric machines 144 to propel the vehicle 108 under other conditions. For example, the HEV 108 may operate in electric mode with the engine 148 off, when it would be inefficient to operate the engine 148. In other embodiments, the vehicle 108 is a battery electric vehicle (BEV) that does not include an engine, or a series HEV that includes an engine that is not mechanically coupled to the wheels (not shown).

The traction battery 106 stores energy that is used by the electric machines 144. The traction battery 106 provides a high voltage direct current (DC) output, according to one embodiment. The traction battery 106 is electrically connected to one or more power electronics modules 154. One or more contactors 156 may isolate the traction battery 106 from other components when opened and connect the traction battery 106 to other components when closed. The power electronics module 154 is also electrically connected to the electric machines 144 and provides the ability to bi-directionally transfer energy between the traction battery 106 and the electric machines 144. For example, the electric machines 144 are three-phase alternating current (AC) machines, according to one embodiment. The power electronics module 154 converts the DC voltage provided by the traction battery 106 to a three-phase AC current to operate the electric machines 144. In a regenerative mode, the power electronics module 154 converts the three-phase AC current generated by the electric machines 144 to the DC voltage compatible with the traction battery 106.

The vehicle 108 includes a variable-voltage converter (VVC) 158 that is electrically connected between the traction battery 106 and the power electronics module 154. The VVC 158 is a DC/DC boost converter to increase or boost the voltage provided by the traction battery 106, according to one embodiment. By increasing the voltage, current requirements may be decreased leading to a reduction in wiring size for the power electronics module 154 and the electric machines 144. Further, the electric machines 144 may be operated with better efficiency and lower losses.

In addition to providing energy for propulsion, the traction battery 106 provides energy to other vehicle systems, according to one embodiment. The vehicle 108 includes a DC/DC converter module 160 that converts the high voltage DC output of the traction battery 106 to a low voltage DC supply that is compatible with low-voltage vehicle loads. An output of the DC/DC converter module 160 is electrically connected to a low-voltage auxiliary battery 162 (e.g., a 12V battery) for charging the auxiliary battery 162. The low-voltage systems may be electrically coupled to the auxiliary battery 162. One or more electrical loads 164 may be coupled to the high-voltage bus. The electrical loads 164 may have an associated controller (not shown) that controls the electrical loads 164 when appropriate. Examples of electrical loads 164 include a fan, an electric heating element and/or an air-conditioning compressor.

The electrified vehicle 108 recharges the traction battery 106 from the external power source 112. The external power source 112 is electrically connected to the ground coil assembly 114 by the external circuit 116 and controlled by the external controller 118. The vehicle coil assembly 126 is electrically connected to the traction battery 106 by the vehicle charging circuit 128, which is controlled by the vehicle controller 110 to condition the power supplied by the external power source 112 to provide the proper voltage and current levels to the traction battery 106.

The vehicle 108 includes one or more wheel brakes 170 for decelerating the vehicle 108. The wheel brakes 170 may be hydraulically actuated, electrically actuated, or some combination thereof. The wheel brakes 170 are part of a brake system 172. The brake system 172 includes other components to operate the wheel brakes 170. For simplicity, the figure depicts a single connection between the brake system 172 and one of the wheel brakes 170. A connection between the brake system 172 and the other wheel brakes 170 is implied. The brake system 172 includes a controller (not shown) to monitor and coordinate the brake system 172. The brake system 172 monitors the brake components and controls the wheel brakes 170 for vehicle deceleration. The brake system 172 responds to driver commands and may also operate autonomously to implement features such as stability control. The controller of the brake system 172 may implement a method of applying a requested brake force when requested by another controller or sub-function.

Electronic modules and controllers in the vehicle 108 communicate via one or more vehicle networks by wired or wireless communication. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 162. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules and controllers. The vehicle network is not shown in FIG. 3 but it may be implied that the vehicle network may connect to any electronic module or controller that is present in the vehicle 108. The vehicle 108 also includes a vehicle system controller (VSC) 174 to coordinate the operation of the various systems and components.

Figure 4:
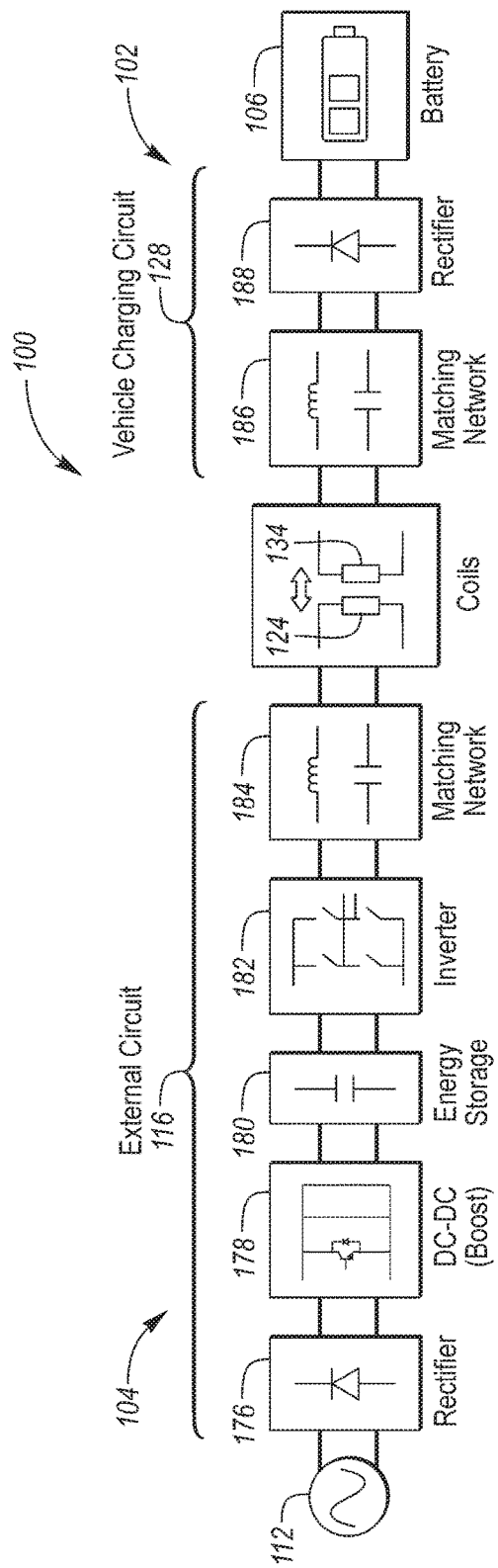
FIG. 4 is a block diagram of the WPT system of FIG. 1.

With reference to FIG. 4, the WPT system 100 includes the vehicle charging subsystem 102 and the external charging subsystem 104. The external charging subsystem 104 includes the power source 112, the external circuit 116 and the primary coil 124 and the vehicle charging subsystem 102 includes the secondary coil 134, the vehicle charging circuit 128 and the traction battery 106.

The external controller 118 controls the external circuit 116 to target a unity input power factor, i.e., where the ratio of the real power transferred to the load (vehicle charging subsystem 102) to the apparent power in the external circuit 116 is one. The external circuit 116 includes a rectifier 176 and a DC-DC converter 178. The rectifier 176 converts alternating current (AC) from the power source 112 to direct current (DC). The DC-DC converter 178 and an energy storage device or capacitor 180 collectively provide a power factor correction function. The output of the energy storage capacitor 180 is a constant voltage that is provided to an inverter 182. The inverter 182 converts the constant voltage to a high-frequency AC voltage. The output voltage of the inverter 182 is supplied to an external matching network 184 such that a low volt-amp stress on components is realized. The external matching network 184 includes reactive components (i.e. inductors and capacitors), according to one embodiment. The output of the external matching network 184 is provided to the primary coil 124.

The vehicle charging circuit 128 includes a matching network 186 and a rectifier circuit 188. The secondary coil 134 is coupled to the primary coil 124. The output of the secondary coil 134 is provided to the vehicle matching network 186. Both the external matching network 184 and the vehicle matching network 186 are used to create magnetic resonance to allow the coils 124, 134 to transfer large amounts of power at acceptable volt-amp levels. The output of the vehicle matching network 186 is provided to the rectifier circuit 188 and filtered to supply DC power to charge the traction battery 106.

Figure 5:
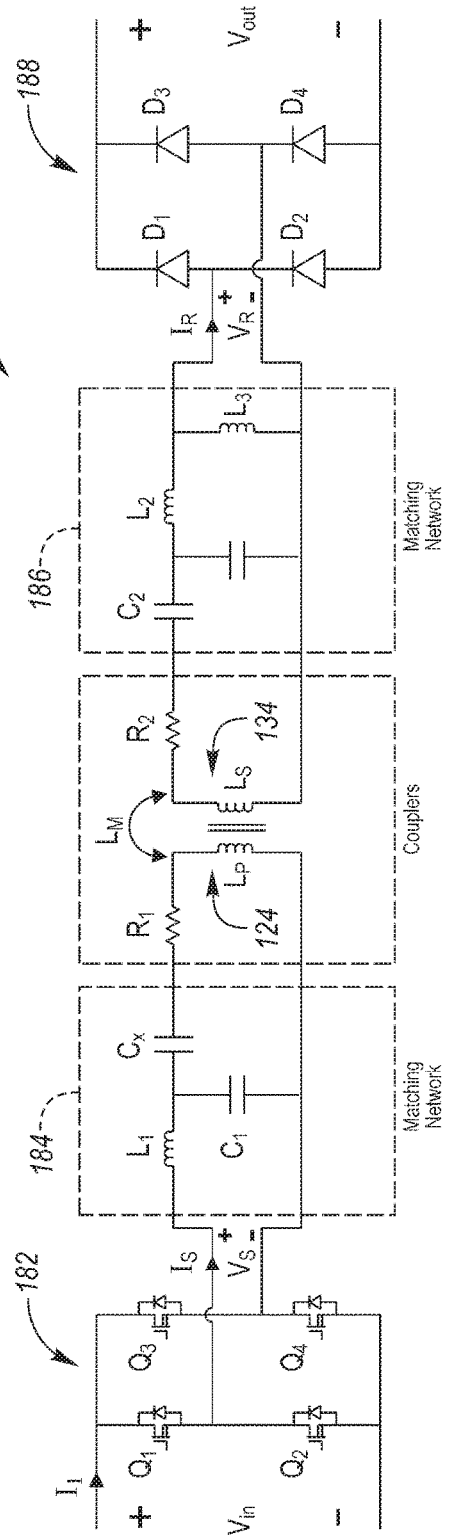
FIG. 5 is a circuit model of the WPT system of FIG. 1.

FIG. 5 is a circuit model 500 of the WPT system 100, according to one embodiment. The inverter 182 includes a plurality of switches, e.g., MOSFETS, according to the illustrated embodiment. The input voltage ($V_{in}$) to the inverter 182 is the voltage at the energy storage capacitor 180 (shown in FIG. 4). $V_{in}$ in is assumed to be constant for this analysis. However, if $V_{in}$ is measured experimentally, it will exhibit a small AC component. The amplitude of this AC component depends on the value of the capacitor 180 and the voltage potential across the capacitor 180, i.e., the root mean square (RMS) voltage. The matching networks 184, 186 are designed to simplify the controller implementation and allow operation with a wide battery voltage range (e.g., 280-420V). In one embodiment, the external matching network 184 includes a series inductor ($L_1$) of 40 µH, a shunt capacitor ($C_1$) of 91.3 nF and a series capacitor ($C_x$) of 18 nF; and the vehicle matching network 186 includes a series capacitor ($C_2$) of 13 nF, a series inductor ($L_2$) of 50 µH and a shunt inductor ($L_3$) of 37.5 µH.

The external controller 118 (FIG. 3) controls the inverter 182 using a modulated signal that is derived by various methods. The external controller 118 uses phase-shift and frequency control methods, e.g., pulse-width modulation (PWM) and pulse-frequency modulation (PFM) to adjust the amplitude and frequency of the inverter output voltage (Vs), according to one or more embodiments. The external controller 118 also controls the voltage potential across the input DC link capacitor (C1) to further improve the efficiency and ensure satisfaction of the load power, according to one embodiment.

Figure 6:
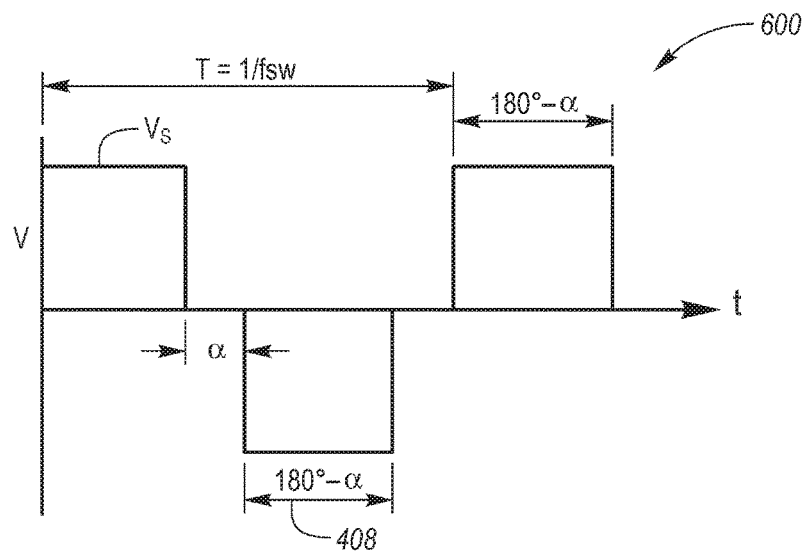
FIG. 6 is a graphical diagram of an output voltage of an inverter of the WPT system of FIG. 1 over time.

FIG. 6 is a waveform 600 illustrating the inverter output voltage ($V_S$) over time. Referring to FIGS. 5 and 6, the external controller 118 controls the inverter output voltage ($V_S$) by adjusting two parameters: the switching frequency ($f_{sw}$) and the phase shift angle ($\alpha$) between its two phase legs. The external controller 118 controls the inverter output voltage ($V_S$) for each switching frequency point to have a maximum value when a is zero and a minimum value for the smallest allowed $\alpha$. By taking the Fourier transform of the waveform shown in FIG. 6, the output voltage of the inverter ($V_S$) can be represented by a sum of sinusoidal waveforms according to Equation 1:

$$V_s = \frac{4V_{in}}{\pi} \sum_{n=1,3,5,...} \frac{1}{n} \cos(n\alpha)\sin(n\omega_{sw}t) \qquad (1)$$

Where $V_{in}$ represents the input voltage to the inverter 182, n represents the harmonic number, $\alpha$ represents the phase shift angle, $\omega_{sw}$ represents the angular switching frequency, where $\omega_{sw}=2\pi f_{sw}$, and t represents time.

FIG. 5 illustrates a circuit model 500 of the WPT system 100, in which the matching networks 184, 186 and the coils 124, 134 are modeled as LC Circuits, which may be collectively referred to as a "resonant tank." The input and output voltages of the resonant tank are modeled as purely sinusoidal waveforms to simplify the WPT system 100. By neglecting the harmonics of the switching frequency, a sinusoidal AC analysis is used to depict the operation of the WPT system 100. A closed-form solution for the transfer gain and component stresses can be determined by using first order network models. This approach provides accurate results for operation in the continuous conduction mode with a high Q-response. A disadvantage of such a modeling approach is recognized when the resonant tank has a low Q-factor or operates in or near the discontinuous conduction mode.

The higher order harmonics generated by the inverter output voltage ($V_S$) have a negligible effect on the system performance. By neglecting the higher order harmonics, equation 1 may be simplified to a first order inverter output voltage, which may be referred to as a fundamental component of the inverter output voltage ($V_{s1}$), as shown by equation 2 below:

$$V_{s1} = \frac{4V_{in}}{\pi}\cos(\alpha)\sin(\omega_{sw}t) \qquad (2)$$

As shown by equation 2, the phase shift angle ($\alpha$), controls the amplitude of the inverter output voltage ($V_S$) to be between 0 and $4V_{in}/\pi$. The minimum inverter output voltage (0) occurs when the phase shift angle ($\alpha$) is 180°, because the cosine of 180° is negative one (−1). And the maximum output voltage ($4V_{in}/\pi$) occurs when the phase shift angle ($\alpha$) is 0°, because the cosine of 0° is one (1). In practice, the maximum value for a is limited to a value less than 180°. Typically, this value is around 120°. Such a constraint ensures that the switches of the inverter 182 can achieve zero voltage switching, and the system maintains high efficiency. The matching network 184 is designed to ensure that the values for the phase shift angle ($\alpha$) and the switching frequency ($f_{sw}$) are within their ranges, for each operating condition.

A simplified model for the WPT system 100 may be derived using sinusoidal ripple approximation (not shown). Sinusoidal ripple approximation is a modeling technique used to evaluate resonant converters by only considering the fundamental components of voltages and current. Again, the matching networks 184, 186 and the coils 124, 134 of FIG. 5 may be collectively referred to as a "resonant tank" or "tank network." A voltage source as defined by Equation 2, i.e., fundamental component ($V_{s1}$) is connected to the input of the tank network (i.e., the external matching network 184) and the output of the tank (i.e., the vehicle matching network 186) is loaded by an effective resistance ($R_e$). Since a rectifier 188 with a capacitive network, i.e. matching network 186 is used to rectify the resonant network's output voltage ($V_R$), it can be assumed that the reflected load resistance has a value that is approximately 81% of load resistance (impedance loading the rectifier). Equation 3 is used to calculate the relationship between the effective load resistance ($R_e$) and the load resistance ($R_L$), assuming that the filter capacitor ($C_2$) is sufficiently large (e.g., more than 10 µF), and the voltage seen at the output of the resonant tank ($V_R$) has a square wave shape:

$$R_e = \frac{8}{\pi^2} R_L \qquad (3)$$

A simplified model for the WPT system 100 may be derived based on these assumptions. The inverter output voltage waveform is approximated by its fundamental component ($V_{s1}$) and the rectifier 188 with the capacitive network 186 is approximated by the reflected load resistance ($R_e$). This simplified model (not shown) would resemble equivalent circuit model 500 of FIG. 5, but the inverter 182 would be replaced by $V_{s1}$ and the rectifier 188 would be replaced by $R_e$. And such a model could be used to understand the dynamics of the WPT system 100 under frequency and phase shift angle control.

The WPT system 100 is connected to the traction battery 106 directly, according to one embodiment. Therefore, the output voltage of the WPT system ($V_R$) is determined by the voltage of the battery 106, which depends on the battery state of charge (SOC). The WPT system 100 is capable of charging various battery packs with different voltage ranges (e.g., 280V to 420V) and at a maximum power of 3.3 kW, according to one embodiment.

Using the simplified model (not shown) for the WPT system 100, the power dissipated through resistor $R_e$ is the load power. The source voltage ($V_{s1}$) represents the inverter output voltage. The voltage across resistor $R_e$ is determined by the battery's output voltage and a full bridge rectifier 188 with a capacitive network 186 is used. Hence, the voltage $V_{R1}$ can be related to the WPT output voltage (battery voltage) ($V_R$) by Equation 4, which can be further simplified to Equation 5 using the sinusoidal approximation:

$$V_R = \frac{4}{\pi} V_{out} \sum_{n=1,3,5,...} \frac{1}{n} \sin(2\pi n F_s t - \varphi_R) \quad (4)$$

$$V_{R1} = \frac{4}{\pi} V_{out} \sin(2\pi n F_s t - \varphi_R) \quad (5)$$

Where $V_R$ represents the output voltage, n represents the harmonic number, $F_s$ represents the switching frequency of the rectifier, $\varphi_R$ represents the phase angle between the voltage and the current and t represents time.

Figure 7:
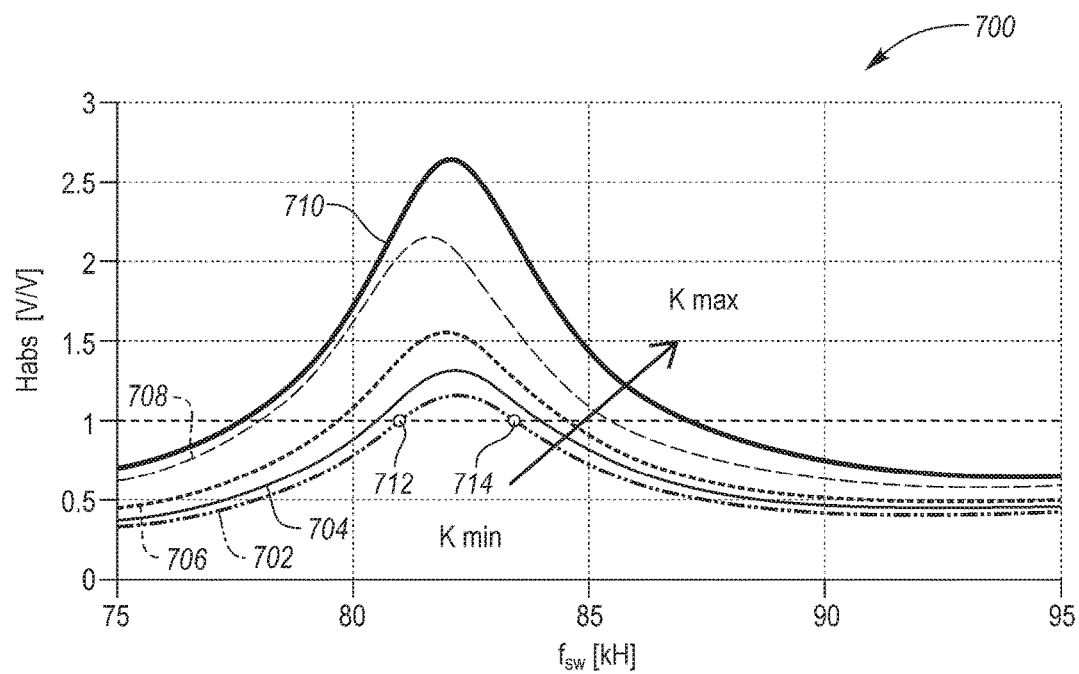
FIG. 7 is a graphical diagram of a transfer function of the WPT system of FIG. 1.

With reference to FIG. 7, by using a sinusoidal approximation, the harmonic components due to the switching elements are neglected. The WPT resonant tank is approximated by its output-to-input transfer function H(s). A model for the WPT system 100 can now be derived numerically. FIG. 7 is a graph 700 illustrating the transfer function (H) for the WPT resonant tank plotted for five different coupling coefficients (K) over the switching frequency ($f_{sw}$). The coupling coefficient (K) relates to the magnetic mutual inductance ($L_M$) described with reference to FIG. 2 by the following equation: $K=L_M/\sqrt{(L_P \cdot L_S)}$. The transfer function (H) is represented by: curve 702 illustrating the transfer function ($H_{K1}$) for a first coupling coefficient (K1), curve 704 illustrating the transfer function ($H_{K2}$) for a second coupling coefficient (K2), curve 706 illustrating the transfer function ($H_{K3}$) for a third coupling coefficient (K3), curve 708 illustrating the transfer function ($H_{K4}$) for a fourth coupling coefficient (K4) and curve 710 illustrating the transfer function ($H_{K5}$) for a fifth coupling coefficient (K5). K1 is the minimum coupling coefficient and K5 is the maximum coupling coefficient. The coupling coefficient (K) is higher when the coils 124, 134 are aligned with each other, than when they are misaligned. It can be realized that when the coupling coefficient (K) changes from its minimum value (curve 702) to its maximum value (curve 710), the output-to-input transfer function (H) changes significantly. The external controller 118 may control the frequency and amplitude of the input voltage $V_S$ to regulate the WPT output voltage for different coupling coefficient cases. In one embodiment, the external controller 118 controls $V_s$ in response to a command from the controller 110. However, the implementation for the controllers 110, 118 may not be straightforward. For example, assume that the switching frequency ($f_{sw}$) is the only parameter used to adjust the gain of the resonant tank to be 1 (unity). However, for each curve, there are two frequency points, as referenced by numerals 712 and 714 that result in a unity gain. Therefore, the controllers 110, 118 must determine which frequency point to use.

Figure 8:
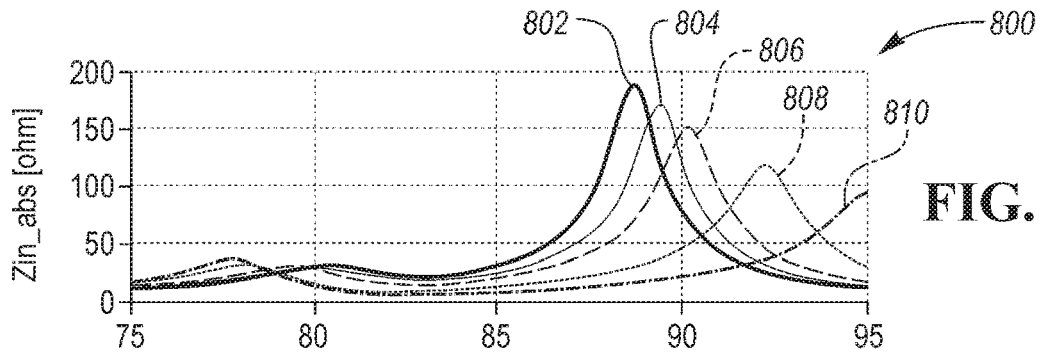
FIG. 8 is a graphical diagram of the input impedance transfer function of an external (ground side) matching network of the WPT system of FIG. 1.
Figure 9:
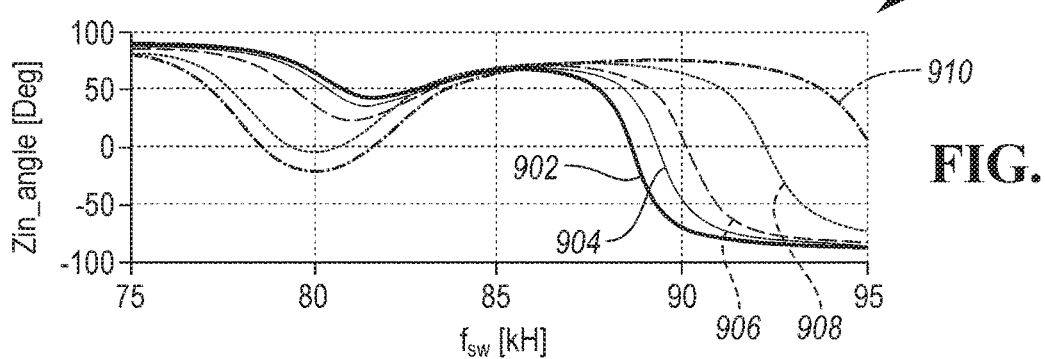
FIG. 9 is a graphical diagram of the input impedance phase angle of the external matching network of the WPT system of FIG. 1.

FIGS. 8 and 9 are graphs illustrating the input impedance of the external matching network 184 of the WPT system 100. FIG. 8 is a graph 800 of the input impedance magnitude transfer function ($Z_{in\_abs}$) and FIG. 9 is a graph 900 of the input impedance phase angle ($Z_{in\_angle}$).

The input impedance magnitude transfer function ($Z_{in\_abs}$) and phase angle ($Z_{in\_angle}$) are plotted for different coupling coefficients. The input impedance magnitude transfer function ($Z_{in\_abs}$) is represented by curves 802, 804, 806, 808 and 810; where each curve represents $Z_{in\_abs}$ for a different coupling coefficient. And the input impedance phase angle ($Z_{in\_angle}$) is represented by curves 902, 904, 906, 908 and 910; where each curve represents $Z_{in\ angle}$ for a different coupling coefficient.

As illustrated by graph 800, the magnitude of the impedance varies significantly with the changes in the coupling coefficient. The inverter current varies as the input impedance to the external matching network 184 (FIG. 5) changes. Additionally, the input impedance phase angle is inductive for some frequency ranges and capacitive for others. If it is desired to achieve soft-switching for the inverter MOSFETs, then it would be desired to load it by an inductive load. Since the input impedance of the resonant network is the impedance loading the inverter output terminals, a frequency point is selected to operate where input impedance is inductive.

In other words, it is desired to operate at a switching frequency ($f_{sw}$) where the input impedance phase angle is positive. However, from the graph 900 in FIG. 9 it can be recognized that for some coupling coefficient cases the input impedance phase angle is positive and for others they are negative. Therefore the controller 110 estimates the coupling coefficient in real-time to prevent hard switching the inverter MOSFETs and potentially damaging the system. Furthermore, by knowing the coils' parameter during operation, the controller 110 determines the ranges for the switching frequency and phase shift angle.

The controllers 110, 118 estimate the parameters of the coils 124, 134 during power transfer to ensure robust operation. The parameters vary for different misalignment conditions, which cause the plant (i.e., the transfer functions) to change, which makes it difficult to estimate the best operating points for the frequency and phase shift angle. Furthermore, the control-to-output for the plant, used to design the controller, also varies with variations in the coils' parameters. Thus, creating a controller around this plant transfer function becomes difficult and the system dynamics may not be controlled according to the specifications for all misalignment conditions.

As described above with reference to FIG. 2, the WPT system 100 calculates the coils' parameters during operation (i.e., in real-time while charging) using voltage and current measurements. In other embodiments, the WPT system 100 estimates the coil parameters in real-time using a Kalman filter (not shown), or determines the coil parameters using an auxiliary coil (not shown) that is tuned to the primary coil 124. A fixed resistance loads this auxiliary coil and the voltage induced across its output may be used to estimate the coupling coefficient.

Figure 10:
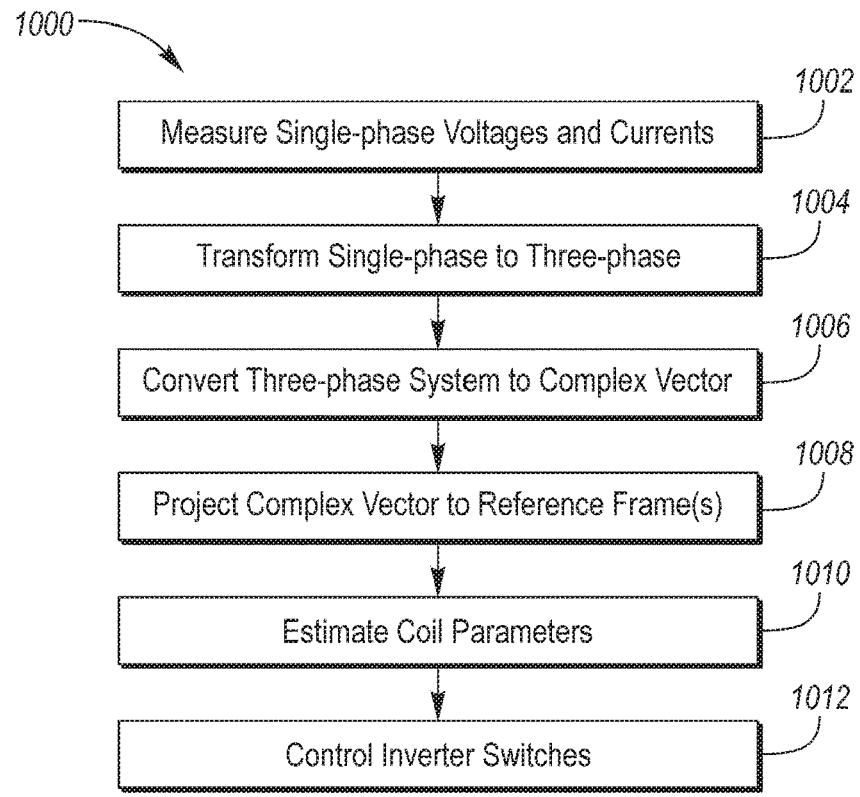
FIG. 10 is a flow chart illustrating a method for controlling the WPT system of FIG. 1, according to one or more embodiments.

With reference to FIG. 10, a method for controlling the WPT system 100 is illustrated in accordance with one or more embodiments and generally referenced by numeral 1000. The method 1000 is implemented as an algorithm using software code contained within the controller 110. In other embodiments, the method is distributed amongst multiple controllers, e.g., the controller 110 and the external controller 118. The controller 110 generally includes any number of microprocessors, ASICs, ICs, memory (e.g., FLASH, ROM, RAM, EPROM and/or EEPROM) and software code to co-act with one another to perform a series of operations. The controller 110 also includes predetermined data, or "look up tables" that are based on calculations and test data and stored within the memory.

At operation 1002, the WPT system 100 measures the single-phase voltages and currents. As described with reference to FIG. 2, the primary voltage sensor 136 and the primary current sensor 138 measure the single-phase voltage and current provided to the primary coil 124; and the secondary voltage sensor 140 and the secondary current sensor 142 measure the single-phase voltage and current received by the secondary coil 134.

At operation 1004, the controller 110 receives the single-phase voltages and currents and transforms them into three-phase components. At operation 1006, the controller 110 converts the three-phase system into a complex rotating space vector. At operation 1008, the controller 110 transforms the complex space vector into a rotating DQ reference frame that is indicative of the three-phase representation of the power. Then at operation 1010 the controller 110 calculates the parameters (i.e. $L_P$, $L_S$, $L_M$) of the coils 124, 134 in real-time using equations derived from a DQ model of the rotating DQ reference frame. Solving these equations allows the calculation of coil parameters to not be influenced by the system dynamics. At operation 1012, the controller 110 determines the inverter switching frequency ($f_{sw}$) and phase shift angle ($\alpha$) using predetermined data based on the coil parameters ($L_P$, $L_S$ and $L_M$). Then the controller 110 provides a command to the external controller 118 to adjust the inverter switches to provide the calculated switching frequency ($f_{sw}$) and phase shift angle ($\alpha$). In one embodiment, the controller 110 uses look-up tables to determine $f_{sw}$ and $\alpha$, as described in U.S. application Ser. No. 15/404,853 to Elshaer et al., the disclosure of which is incorporated by reference herein.

FIGS. 11-14 and equations 1-48 illustrate the derivation of the coil parameter equations. The single-phase voltages and currents are transformed into three-phase components. The measured voltage waveform ($V_{p1}$) of the primary coil 124 is described by Equation 6. The $V_{p1}$ voltage waveform varies as function of time and its magnitude $|v_{p1}|$ and phase angle ($\varphi$). The voltage waveform is converted to a time invariant form that captures these quantities.

$$v_{p1} = |v_{p1}|\sin(\omega t + \varphi) \quad (6)$$

A DQ transformation is used to convert the time varying waveform ($v_{p1}$) to a rotating complex vector. The switching frequency ($f_{sw}$) is known because it is regulated by the controller 110. Hence, the rotation angular frequency (w) of this complex vector is known, because $\omega = 2\pi f_{sw}$. A DQ transformation uses three-phase systems, but the WPT system 100 is a single-phase system. Therefore, in order to create this complex vector, two fictitious time varying waveforms ($v_{p2}$ and $v_{p3}$) are generated from $v_{p1}$. The two fictitious waveforms are constructed by delaying the measured voltage by a time interval such that the first fictitious waveform ($v_{p2}$) is phase shifted by 120° from $v_{p1}$, as represented by Equation 7, and the second fictitious waveform ($v_{p3}$) is phase shifted by 240° from $v_{p1}$, as represented by Equation 8. The two digitally constructed waveforms ($v_{p2}$ and $v_{p3}$) and the originally measured waveform ($v_{p1}$) correspond to a three-phase system.

$$v_{p2} = |v_{p2}|\sin\left(\omega t + \varphi - \frac{2\pi}{3}\right) \quad (7)$$

$$v_{p3} = |v_{p3}|\sin\left(\omega t + \varphi + \frac{2\pi}{3}\right) \quad (8)$$

Figure 11:
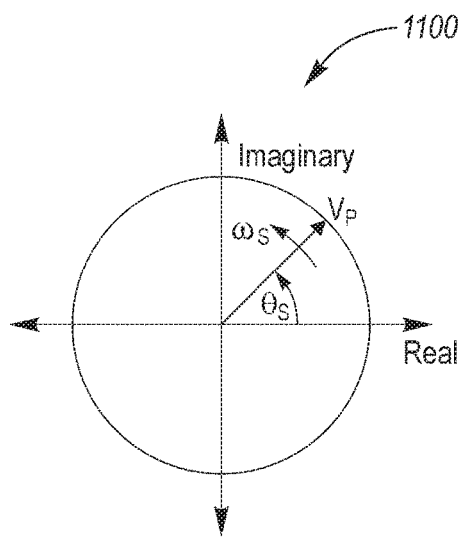
FIG. 11 is a graph illustrating a rotating space vector of the WPT system of FIG. 1.

The three-phase system is then converted into a complex rotating space vector ($V_P$), as represented by Equation 9. FIG. 11 is a plot 1100 illustrating $V_P$ along with the direction and trajectory at which it rotates. This space vector ($V_P$) is rotating with angular frequency $\omega_s$ and has a magnitude that is equivalent to the amplitude of the measured voltage waveform. The magnitude $V_P$ does not change as a function of time. The angular position ($\theta_s$) of $V_P$ corresponds to the position of $V_P$ as a function of time, i.e., $\theta_s = \omega t + \varphi$.

$$V_P = \frac{2}{3}\left[v_{p1} + e^{j\frac{2\pi}{3}}v_{p2} + e^{j\frac{4\pi}{3}}v_{p3}\right] \quad (9)$$

A similar approach is used for the secondary side, i.e., the vehicle side, to derive a complex rotating space vector ($V_S$) for the secondary side, as represented by Equation 10.

$$V_s = \frac{2}{3}\left[v_{s1} + e^{j\frac{2\pi}{3}}v_{s2} + e^{j\frac{4\pi}{3}}v_{s3}\right] \quad (10)$$

A complex space vector is also created for the measured primary current waveform and the measured secondary current waveform using the approach described above for the primary voltage.

The result of this transformation is a complex number that represents each of the measured signals. Equation 11 represents a current quantity measured on the primary side. And as done before for the measured voltage signal, two fictitious current signals are created, as shown by Equation 12 and Equation 13. A complex rotating space vector ($I_P$) is derived for the primary side current and a complex rotating space vector ($I_S$) for the secondary side current as represented by Equations 14 and 15, respectively.

$$i_{p1} = |i_{p1}|\sin(\omega t + \varphi) \quad (11)$$

$$i_{p2} = |i_{p2}|\sin\left(\omega t + \varphi - \frac{2\pi}{3}\right) \quad (12)$$

$$i_{p3} = |i_{p3}|\sin\left(\omega t + \varphi + \frac{2\pi}{3}\right) \quad (13)$$

$$I_P = \frac{2}{3}\left[i_{p1} + e^{j\frac{2\pi}{3}}i_{p2} + e^{j\frac{4\pi}{3}}i_{p3}\right] \quad (14)$$

$$I_S = \frac{2}{3}\left[i_{s1} + e^{j\frac{2\pi}{3}}i_{s2} + e^{j\frac{4\pi}{3}}i_{s3}\right] \quad (15)$$

The complex space vector is transformed into other reference frames, and each space vector (e.g., $V_P$, $V_S$, $I_P$ and $I_S$) is projected onto three different reference frames: 1) an a-b-c frame; 2) a stationary DQ frame; and 3) a rotating DQ frame.

Figure 12:
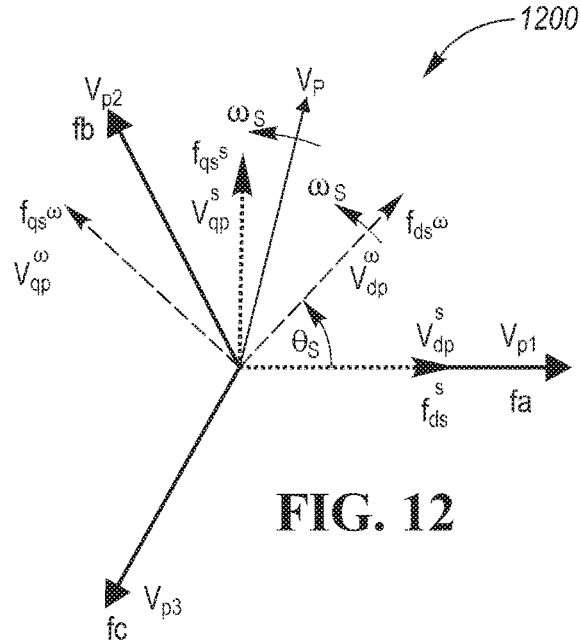
FIG. 12 is a graph illustrating a projection of a space vector of the WPT system of FIG. 1 on different reference frames.

FIG. 12 is a three-dimensional plot 1200 illustrating the space vector ($V_P$) overlaid with the three reference frames, with $V_P$ illustrated in solid-thin line, the a-b-c frame in solid thick line, the stationary DQ frame in dashed line; and the rotating DQ frame in dotted line. The a-b-c frame (solid thick line) illustrates the three voltage phases ($V_{p1}$, $V_{p2}$, and $V_{p3}$) from equations 7-9, projected on the a-b-c axes, respectively. The stationary DQ frame (dashed line) illustrates the real part of $V_P$ projected on the d-axis (direct axis) and the imaginary part of $V_P$ projected on the q-axis. The rotating DQ frame (dotted line) also illustrates the real part of $V_P$ projected on the d-axis (direct axis) and the imaginary part of $V_P$ projected on the q-axis. By projecting $V_P$ on the stationary reference frame $f_{dq}{}^s$ (dashed line) results in time varying projected components on the d-axis and q-axis. Since the real part of $V_P$ projects on the d-axis and its imaginary part projects on the q-axis, one can conclude that if $V_d{}^s$ and $V_q{}^s$ are plotted as a function of time, they will result in two sinusoidal signals that are phase-shifted from each other by 90°. Similarly, by projecting $V_P$ on an axis that is rotating with an angular frequency equal to the switching frequency, the projection of $V_P$ on the rotating DQ frame (dotted) yields the $V_d{}^\omega$ component, which projects on the rotating d-axis, and $V_q{}^\omega$ component, which projects on the rotating q-axis. Since the rotating DQ axis is rotating at the same angular frequency as the space vector $V_P$, the projection of $V_P$ on the rotating axis results in time invariant quantities. The other space vectors (e.g., $V_S$, $I_P$, $I_S$) may be overlaid on a common plot (not shown) to illustrate the relationship between the vectors.

Next, a DQ model of the coupled coils 124, 134 is created. The arrangement of the voltage sensors 136, 140 and current sensors 138, 142 at the terminals of the primary and secondary coils 124, 134 (as shown in FIG. 2), allows for simplified analysis of the WPT system 100. This allows the vehicle charging subsystem 102 to couple with different external charging subsystems 104, e.g., one at home and one at work, that have different external circuits 116.

The measured time varying voltages and currents are used to create a rotating complex vector, which does not change its magnitude as a function of time during steady-state, as shown in FIG. 11. The magnitude and phase angle of the fundamental components of the measured waveforms are calculated from this complex vector. Then the inverter may be controlled by adjusting its switching frequency and the phase-shift angle between its two poles. The components of the voltages and currents in the system 100 are controlled to have the same frequency as the inverter switching frequency and their amplitude depends on the phase shift angle (α).

Figure 13:
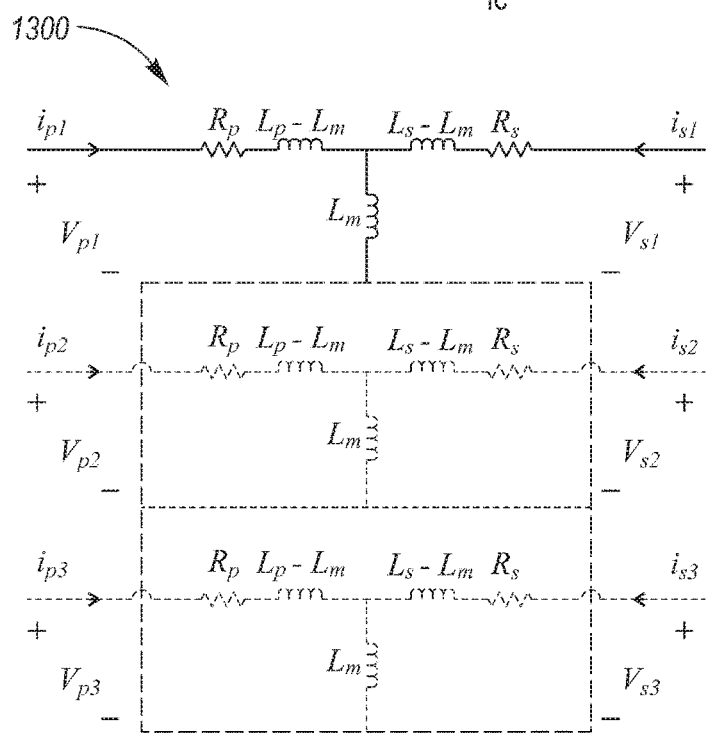
FIG. 13 is a T-network equivalent circuit of a primary coil and a secondary coil of the WPT system of FIG. 1.

With reference to FIG. 13, the primary coil 124 and the secondary coil 134 may be represented by a T-network 1300 with the two coupled coils 124, 134 represented by one inductor ($L_M$), as shown in solid line. In order to create a balanced three-phase system, the two additional fictitious phases are added, as illustrated by dashed lines, to illustrate how the following analytical equations are derived for calculating the parameters of the coils 124, 134.

As described above with reference to equations 6-15, a balanced three-phase waveform was created for each measured voltage and current signal (i.e., complex rotating space vectors $V_P$, $V_S$, $I_P$ and $I_S$). The T-network equivalent circuit 1300 is representative of these calculations. Thus, complex rotating space vectors $V_P$, $V_S$, $I_P$ and $I_S$ can be calculated by measuring the phase-to-neutral voltages and line currents of the network 1300.

The following equations describe derivations of the analytical expressions governing the dynamics of the three-phase T-network equivalent circuit 1300. By using Kirchoff's voltage law, expressions for the primary and secondary three phase-voltages are derived in Equations 16 and 17, respectively.

$$\begin{bmatrix} V_{p1} \\ V_{p2} \\ V_{p3} \end{bmatrix} = R_p \begin{bmatrix} i_{p1} \\ i_{p2} \\ i_{p3} \end{bmatrix} + L_p \frac{d}{dt}\begin{bmatrix} i_{p1} \\ i_{p2} \\ i_{p3} \end{bmatrix} + L_M \frac{d}{dt}\begin{bmatrix} i_{s1} \\ i_{s2} \\ i_{s3} \end{bmatrix} \qquad (16)$$

$$\begin{bmatrix} V_{s1} \\ V_{s2} \\ V_{s3} \end{bmatrix} = R_s \begin{bmatrix} i_{s1} \\ i_{s2} \\ i_{s3} \end{bmatrix} + L_s \frac{d}{dt}\begin{bmatrix} i_{s1} \\ i_{s2} \\ i_{s3} \end{bmatrix} + L_M \frac{d}{dt}\begin{bmatrix} i_{p1} \\ i_{p2} \\ i_{p3} \end{bmatrix} \qquad (17)$$

The expressions above quantify the dependence of both coils' three-phase voltages on their parameters and three-phase currents. By substituting the corresponding value for each of the phase voltages, (as defined by equation 16) into the space vector equation (as defined by equation 9), the rotating space vector $V_P$ can, instead, be expressed by the primary coil's parameters as shown in equation 18. It can be recognized that the primary and secondary current terms (as defined by equations 14 and 15) can also be substituted in equation 18 to yield an expression for the rotating space vector for the primary coil voltage ($V_P$), that is function of the primary coil's parameters and the primary and secondary rotating space vector currents, as defined by equation 19.

$$\begin{aligned} V_P &= \frac{2}{3}\left(V_{p1} + V_{p2}e^{j\frac{2\pi}{3}} + V_{p3}e^{j\frac{4\pi}{3}}\right) \\ &= \frac{2}{3}\left[R_p\left(i_{p1} + e^{j\frac{2\pi}{3}}i_{p2} + e^{j\frac{4\pi}{3}}i_{p3}\right)\right] + \\ &\quad L_p\frac{d}{dt}\left(i_{p1} + e^{j\frac{2\pi}{3}}i_{p2} + e^{j\frac{4\pi}{3}}i_{p3}\right) + \\ &\quad L_M\frac{d}{dt}\left(i_{s1} + e^{j\frac{2\pi}{3}}i_{s2} + e^{j\frac{4\pi}{3}}i_{s3}\right) \end{aligned} \qquad (18)$$

$$V_P = R_P I_P + L_P \frac{d}{dt}I_P + L_M \frac{d}{dt}I_S \qquad (19)$$

Similarly, an expression for the rotating space vector for the secondary coil voltage ($V_S$) can be derived, as shown by equation 20. Further simplification is done by substituting equations 14 and 15 into equation 20 to provide an expression for the secondary voltage space vector ($V_S$) as defined by equation 21.

$$\begin{aligned} V_S &= \frac{2}{3}\left(V_{s1} + V_{s2}e^{j\frac{2\pi}{3}} + V_{s3}e^{j\frac{4\pi}{3}}\right) \\ &= \frac{2}{3}\left[R_s\left(i_{s1} + e^{j\frac{2\pi}{3}}i_{s2} + e^{j\frac{4\pi}{3}}i_{s3}\right)\right] + \\ &\quad L_s\frac{d}{dt}\left(i_{s1} + e^{j\frac{2\pi}{3}}i_{s2} + e^{j\frac{4\pi}{3}}i_{s3}\right) + \\ &\quad L_M\frac{d}{dt}\left(i_{p1} + e^{j\frac{2\pi}{3}}i_{p2} + e^{j\frac{4\pi}{3}}i_{p3}\right) \end{aligned} \qquad (20)$$

$$V_S = R_S I_S + L_S \frac{d}{dt}I_S + L_M \frac{d}{dt}I_P \qquad (21)$$

The expressions defined by equations 19 and 21 represent the equivalent circuit 1300 in a stationary reference frame. The space vectors $V_S$ and $I_S$ rotate counter clockwise as a function of time. Furthermore, these space vectors may be represented by a time varying complex number. As shown in equations 22-25, the rotating space vectors derived earlier are equivalent to a rotating space vector in the DQ stationary reference frame.

$$V_p = V_{dq\_p}{}^s = V_{d\_p}{}^s + jV_{q\_p}{}^s \qquad (22)$$

$$V_s = V_{dq\_s}{}^s = V_{d\_s}{}^s + jV_{q\_s}{}^s \qquad (23)$$

$$I_p = I_{dq\_p}{}^s = I_{d\_p}{}^s + jI_{q\_p}{}^s \quad (24)$$

$$I_s = I_{dq\_s}{}^s = I_{d\_s}{}^s + jI_{q\_s}{}^s \quad (25)$$

Where the superscript "s" represents the stationary axis; superscript "ω" represents the rotating axis; the subscript DQ represents the DQ reference frame; and the subscripts "_p" and "_s" indicate variables representing a quantity in the primary coil side and the secondary side, respectively.

Since the switching frequency ($f_{sw}$) is known, the angular frequency (ω) at which the above space vector rotates can be determined for any given switching frequency. By projecting the rotating space vectors, as described by equations 22-25, to a rotating axis, the projected quantities are not expected to vary as function of time. The space vector described by the term $e^{-j\omega t}$ rotates in the counter clockwise direction as function of time and has a magnitude of 1. While the previously derived space vectors, as described by equations 22-25, rotate in the counter clockwise direction, multiplying them by the term $e^{-j\omega t}$ results in a stagnant space vector that is time invariant. This technique is known as referencing a rotating space vector to a rotating axis, which rotates at the same angular frequency as that rotating space vector. Equations 26-27 represent the space vector for the primary and secondary voltages and currents in a rotating reference frame. With this information, equations 19 and 21 are converted from the stationary reference frame (as denoted by superscript "s") to the rotating reference frame (as denoted by superscript "ω").

$$V_{dq\_p}{}^\omega = V_{dq\_p}{}^s e^{-j\omega_s t} \quad (26)$$

$$I_{dq\_p}{}^\omega = I_{dq\_p}{}^s e^{-j\omega_s t} \quad (27)$$

$$V_{dq\_s}{}^\omega = V_{dq\_s}{}^s e^{-j\omega_s t} \quad (28)$$

$$I_{dq\_s}{}^\omega = I_{dq\_s}{}^s e^{-j\omega_s t} \quad (29)$$

An equivalent circuit in the DQ reference frame is found by converting equations 19 to the rotating reference frame, which is achieved by multiplying both sides of these equations by the term $e^{-j\omega t}$, which yields the expression shown in equation 30. A similar conversion may be made for equation 21 (not shown).

$$V_p e^{-j\omega_s t} = R_p I_p e^{-j\omega_s t} + L_p e^{-j\omega_s t} \frac{d}{dt} I_p + L_M e^{-j\omega_s t} \frac{d}{dt} I_s \quad (30)$$

By using the chain rule to evaluate the term $d/dt\,[I_p e^{-j\omega_s t}]$ as shown in equation 31, the term $L_p e^{-j\omega_s t}\,d/dt\,I_p$ is now represented by equation 32.

$$L_p \frac{d}{dt}[I_p e^{-j\omega_s t}] = L_p e^{-j\omega_s t} \frac{d}{dt} I_p - j\omega_s L_p e^{-j\omega_s t} I_p \quad (31)$$

$$L_p e^{-j\omega_s t} \frac{d}{dt} I_p = L_p \frac{d}{dt}[I_p e^{-j\omega_s t}] + j\omega_s L_p e^{-j\omega_s t} I_p \quad (32)$$

A similar approach is taken to resolve the term $L_M e^{-j\omega_s t}\,d/dt\,I_S$. And equation 30 is can be written as shown in equation 33.

$$V_p e^{-j\omega_s t} = R_p I_p e^{-j\omega_s t} + L_p \frac{d}{dt}[I_p e^{-j\omega_s t}] + \quad (33)$$

$$j\omega_s L_p e^{-j\omega_s t} I_p + L_M \frac{d}{dt}[I_s e^{-j\omega_s t}] + j\omega_s L_M e^{-j\omega_s t} I_s$$

Each rotating space vector in the stationary reference frame can be replaced by a space vector in the rotating DQ reference frame as shown in equation 34. And a similar approach is taken to express the secondary voltage side in the rotating DQ reference frame, as shown in equation 35.

$$V_{dq\_p}^\omega = R_p I_{dq\_p}^\omega + L_p \frac{d}{dt} I_{dq\_p}^\omega + j\omega_s L_p I_{dq\_p}^\omega + L_M \frac{d}{dt} I_{dq\_s}^\omega + j\omega_s L_M I_{dq\_s}^\omega \quad (34)$$

$$V_{dq\_s}^\omega = R_s I_{dq\_s}^\omega + L_s \frac{d}{dt} I_{dq\_s}^\omega + j\omega_s L_s I_{dq\_s}^\omega + L_M \frac{d}{dt} I_{dq\_p}^\omega + j\omega_s L_M I_{dq\_p}^\omega \quad (35)$$

The flux linkage inside each coil 124, 134 can be determined by the current flowing through the primary and secondary coils. By using the same procedure as before, the flux linkage for the primary and secondary coils in the rotating DQ reference frame can be written according to equation 36 and equation 37, respectively.

$$\lambda_{dq\_p}{}^\omega = L_p I_{dq\_p}{}^\omega + L_m I_{dq\_s}{}^\omega \quad (36)$$

$$\lambda_{dq\_s}{}^\omega = L_s I_{dq\_s}{}^\omega + L_M I_{dq\_p}{}^\omega \quad (37)$$

Consequently, by rearranging the terms in equation 34 and equation 35, the flux linkage expressions, defined in equations 36 and 37 can be substituted in voltage equations 34 and 35. Hence, the primary and secondary voltage at the terminals of the coils 124, 134 can be written as shown in equations 38 and 39, respectively.

$$V_{dq\_p}^\omega = R_p I_{dq\_p}^\omega + \frac{d}{dt}[L_p I_{dq\_p}^\omega + L_m I_{dq\_s}^\omega] + j\omega_s [L_p I_{dq\_p}^\omega + L_m I_{dq\_s}^\omega] = \quad (38)$$

$$R_p I_{dq\_p}^\omega + \frac{d}{dt}\lambda_{dq\_p}^\omega + j\omega_s \lambda_{dq\_p}^\omega$$

$$V_{dq\_s}^\omega = R_s I_{dq\_s}^\omega + \frac{d}{dt}[L_s I_{dq\_s}^\omega + L_M I_{dq\_p}^\omega] + j\omega_s [L_s I_{dq\_s}^\omega + L_M I_{dq\_p}^\omega] = \quad (39)$$

$$R_s I_{dq\_s}^\omega + \frac{d}{dt}\lambda_{dq\_s}^\omega + j\omega_s \lambda_{dq\_s}^\omega$$

Furthermore, equations 38 and 39 may be used to solve for the current of the primary and secondary coil 124, 134 as a function of the flux linkages and the physical parameters of the coils 124, 134, as shown in equations 40 and 41.

$$I_{dq\_p}^\omega = \frac{L_m}{L_m^2 - L_p L_s}\lambda_{dq\_s}^\omega - \frac{L_s}{L_m^2 - L_p L_s}\lambda_{dq\_p}^\omega \quad (40)$$

$$I_{dq\_s}^\omega = \frac{L_m}{L_m^2 - L_p L_s}\lambda_{dq\_p}^\omega - \frac{L_p}{L_m^2 - L_p L_s}\lambda_{dq\_s}^\omega \quad (41)$$

Figure 14:
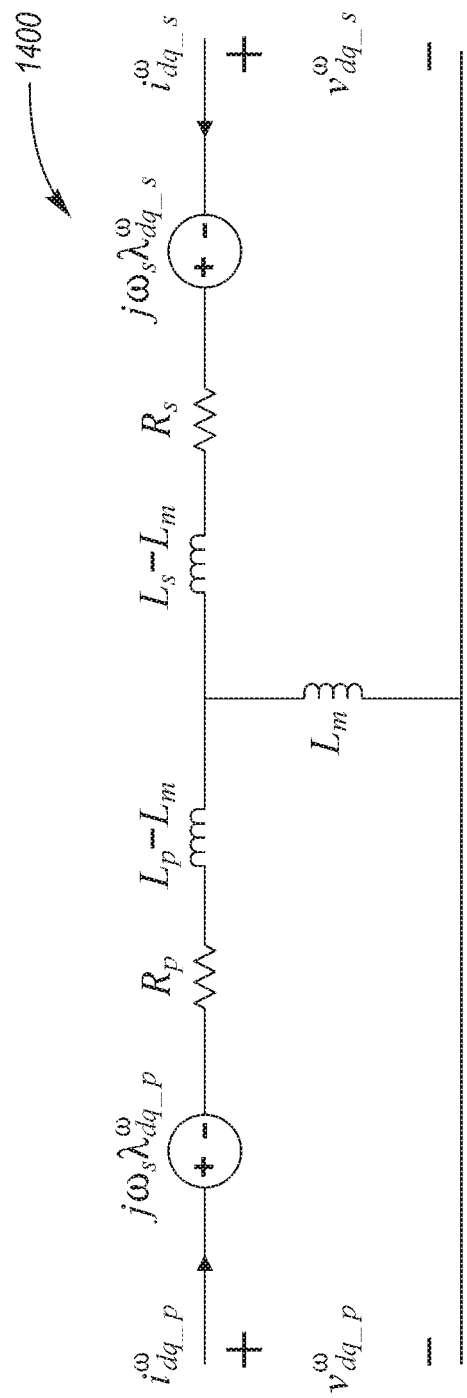
FIG. 14 is an equivalent circuit of the T-network of FIG. 13 in a direct-quadrature-zero (DQ) reference frame.

By using equations 38 and 39, an equivalent circuit for the coupled coils may be derived as shown in FIG. 14, and referenced by numeral 1400.

Equations 38 and 39 are in complex form, which means that their real component corresponds to the flux linkage in the d-axis and their imaginary component corresponds to the flux linkage in the q-axis. Flux linkage in the d-axis and q-axis for both the primary and secondary coils are described in equations 42-45.

$$\lambda_{d\_p}{}^{\omega}=L_pI_{d\_p}{}^{\omega}+L_MI_{d\_s}{}^{\omega} \quad (42)$$

$$\lambda_{q\_p}{}^{\omega}=L_pI_{q\_p}{}^{\omega}+L_MI_{q\_s}{}^{\omega} \quad (43)$$

$$\lambda_{d\_s}{}^{\omega}=L_sI_{d\_s}{}^{\omega}+L_MI_{d\_p}{}^{\omega} \quad (44)$$

$$\lambda_{q\_s}{}^{\omega}=L_sI_{q\_s}{}^{\omega}+L_MI_{q\_p}{}^{\omega} \quad (45)$$

Equations for the coil parameters (i.e., $L_P$, $L_S$ and $L_M$) are derived from solving any three of the above four equations (i.e., equations 42-45), as shown by equations 46-48 below:

$$L_p = \frac{\lambda_{q\_p}^{\omega}I_{d\_s}^{\omega} - \lambda_{d\_p}^{\omega}I_{q\_s}^{\omega}}{I_{q\_p}^{\omega}I_{d\_s}^{\omega} - I_{d\_p}^{\omega}I_{q\_s}^{\omega}} \quad (46)$$

$$L_m = \frac{\lambda_{q\_p}^{\omega}I_{d\_p}^{\omega} - \lambda_{d\_p}^{\omega}I_{q\_p}^{\omega}}{I_{q\_s}^{\omega}I_{d\_p}^{\omega} - I_{d\_s}^{\omega}I_{q\_p}^{\omega}} \quad (47)$$

$$L_s = \frac{\lambda_{q\_s}^{\omega}I_{d\_p}^{\omega} - \lambda_{d\_s}^{\omega}I_{q\_p}^{\omega}}{I_{q\_s}^{\omega}I_{d\_p}^{\omega} - I_{d\_s}^{\omega}I_{q\_p}^{\omega}} \quad (48)$$

Figure 15:
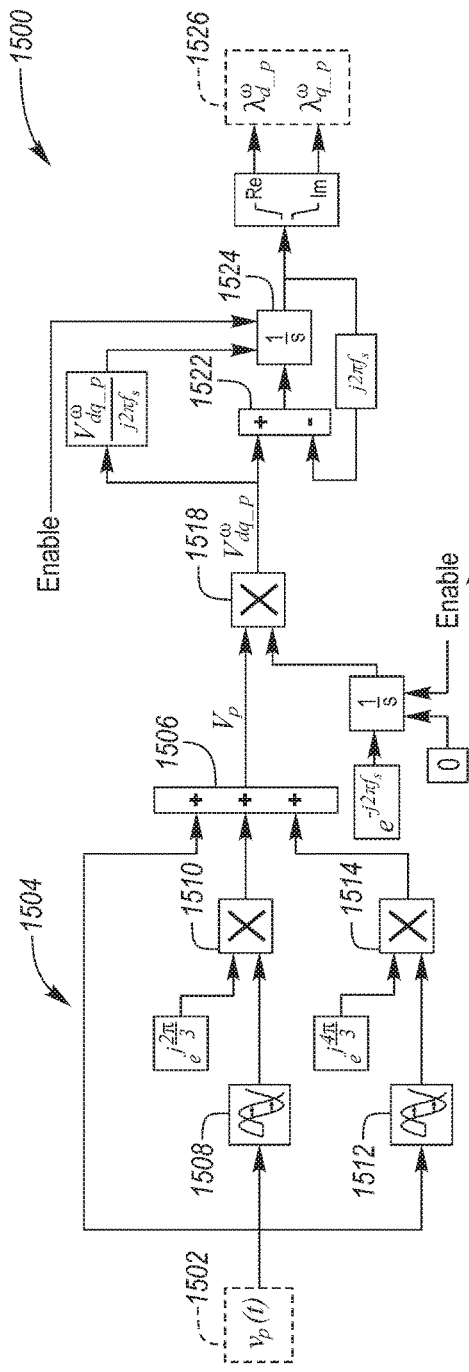
FIG. 15 is a block diagram illustrating a control system for implementing the method of FIG. 10, according to one embodiment.

FIG. 15 is a block diagram illustrating a control system 1500 for estimating coil parameters in real-time as described with reference to operations 1004-1010 of FIG. 10. The control system 1500 is implemented using software code contained within the controller 110, according to one embodiment.

The input to the control system 1500 is one of the measured single-phase voltages as a function of time (i.e., $V_{p1}(t)$ or $V_{s1}(t)$), as referenced by numeral 1502. The illustrated embodiment depicts the primary single-phase voltage ($V_{p1}(t)$) as the input.

Then the control system 1500 transforms the single-phase value to three-phase values, as generally referenced by numeral 1504. The measured first phase voltage ($V_{p1}$) is provided to a summation block 1506. The second phase voltage waveform is created by shifting the measured first phase value by 120°, as described above with reference to equation 7, and indicated by phase shift block 1508, and then multiplying this waveform by $e^{(j2\pi)/3}$, as described above with reference to equation 9, and indicated by multiplication block 1510. This calculated second phase voltage value is also provided to the summation block 1506. The third phase voltage waveform is created by shifting the measured first phase value by 240°, as described above with reference to equation 8, and indicated by phase shift block 1512, and then multiplying this waveform by $e^{(j4\pi)/3}$, as described above with reference to equation 9, and indicated by multiplication block 1514. This calculated third phase voltage is also provided to the summation block 1506.

At summation block 1506, the control system 1500 transforms the three-phase system to a complex vector, as described above with reference to equations 9.

Then at multiplication block 1518, the control system 1500 projects the complex vector ($V_P$) to a rotating DQ reference frame ($V_{dq\_P}{}^{\omega}$). As described above with reference to equation 22, the complex vector is equivalent to a space vector in a stationary DQ reference frame. The control system 1500 converts the space vector to the rotating DQ reference frame by multiplying the output of summation block 1506 (i.e., $V_P$) by the product of ($e^{-j2\pi fsw}$) and (1/s), as described above with reference to equation 26. The 1/s block is used to integrate its input. The [0] indicates the initial condition to the integrator, which in this case is zero. The controller 110 enables the (1/s) block in response to an enable signal, as generally referenced by numeral 1520.

Blocks 1522, 1524 and 1526 represent decomposing complex numbers into their real and imaginary parts. At block 1522, the control system 1500 subtracts $j2\pi f_{sw}$ from the rotating DQ reference frame ($V_{dq\_P}{}^{\omega}$). At block 1524, the controller 110 multiplies the output of block 1522 by (1/s) to provide the flux linkage in the rotating DQ reference frame for the primary coil ($\lambda_{dq\_P}{}^{\omega}$) as referenced by numeral 1526.

The same general control system 1500 is used to calculate the secondary coil's flux linkage (i.e., $\lambda^{\omega}_{d\_s}$ and $\lambda^{\omega}_{q\_s}$) at 1526, when the secondary voltage $V_{s1}(t)$ is the input measured value 1502 (not shown).

Figure 16:
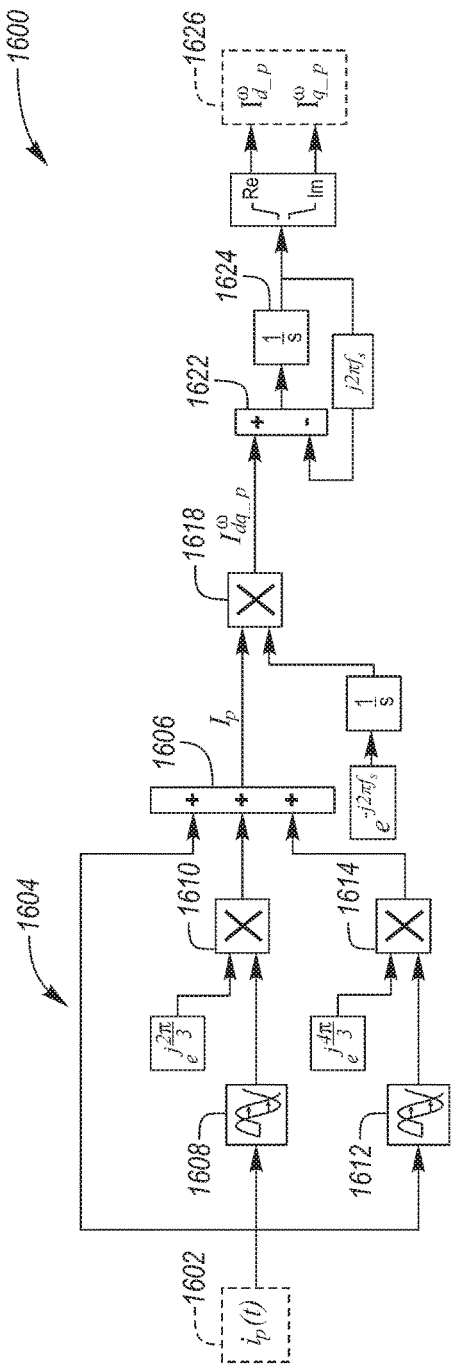
FIG. 16 is another block diagram illustrating a control system for implementing the method of FIG. 10, according to another embodiment

FIG. 16 is a block diagram illustrating another control system 1600 for estimating coil parameters in real time as described with reference operations 1004-1010 of FIG. 10, according to one or more embodiments. The control system 1600 is implemented using software code contained within the controller 110, according to one embodiment.

The input to the control system 1600 is one of the measured single-phase current values as a function of time (i.e., $i_{p1}(t)$ or $i_{s1}(t)$), as referenced by numeral 1602. The illustrated embodiment depicts the primary single-phase current ($i_{p1}(t)$) as the input.

Then the control system 1600 transforms the single-phase current value to three-phase current values, as generally referenced by numeral 1604. The measured first phase current is provided to a summation block 1606. The second phase current waveform is created by shifting the measured first phase current value by 120°, as described above with reference to equation 12, and indicated by phase shift block 1608, and then multiplying this waveform by $e^{(j2\pi)/3}$, as described above with reference to equation 14, and indicated by multiplication block 1610. This calculated second phase current is also provided to the summation block 1606. The third phase current waveform is created by shifting the measured first phase value by 240°, as described above with reference to equation 13, and indicated by phase shift block 1612, and then multiplying this waveform by $e^{(j4\pi)/3}$, as described above with reference to equation 14, and indicated by multiplication block 1614. This calculated third phase current is also provided to the summation block 1606.

At summation block 1606, the control system 1600 transforms the three-phase system to a complex vector, as described above with reference to equation 14.

Then at multiplication block 1618, the control system 1600 projects the complex vector ($I_P$) to a rotating DQ reference frame ($I_{dq\_P}{}^{\omega}$). As described above with reference to equations 24, the complex vector is equivalent to a space vector in a stationary DQ reference frame. The control system 1600 converts the space vector to the rotating DQ reference frame by multiplying the output of summation block 1606 (i.e., $I_P$) by the product of ($e^{-j2\pi fsw}$) and (1/s), as described above with reference to equation 27.

Blocks 1622, 1624 and 1626 represent decomposing complex numbers into their real and imaginary parts. At block 1622, the control system 1500 subtracts $j2\pi f_{sw}$ from the rotating DQ reference frame ($I_{dq\_P}{}^{\omega}$). At block 1624, the controller 110 multiplies the output of block 1622 by (1/s) to provide the primary current in the rotating DQ reference frame ($I_{dq\_P}{}^{\omega}$) as referenced by numeral 1626.

The same general control system 1600 is used to calculate the secondary current in the rotating DQ reference frame ($I_{dq\_S}{}^{\omega}$) at 1626, when the secondary current $I_{s1}(t)$ is the input measured value 1602 (not shown).

Then the control system 1500 estimates the coil parameters ($L_P$, $L_S$, $L_M$) as described above with reference to equations 46-48. These parameters will be given to the controller 110 which may be used to tune the controller parameters to the best values to allow stable control for the WPT system 100.

Figures 17, 18:
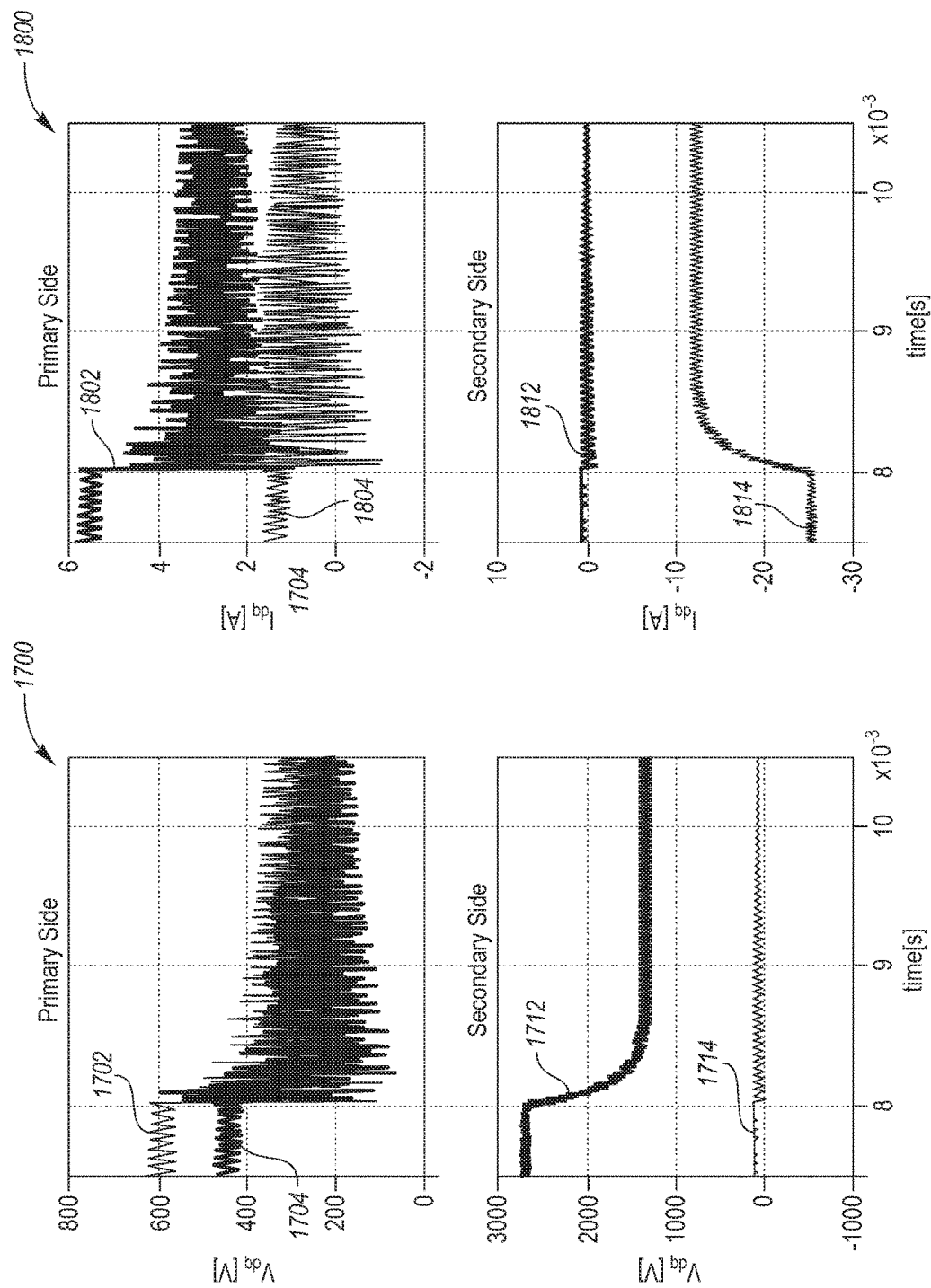
FIG. 17 is a graphical diagram of measured operating characteristics of the WPT system of FIG. 1 converted to the DQ reference frame, and illustrated with respect to time.
FIG. 18 is another graphical diagram of measured operating characteristics of the WPT system of FIG. 1 converted to the DQ reference frame, and illustrated with respect to time.
Figure 19:
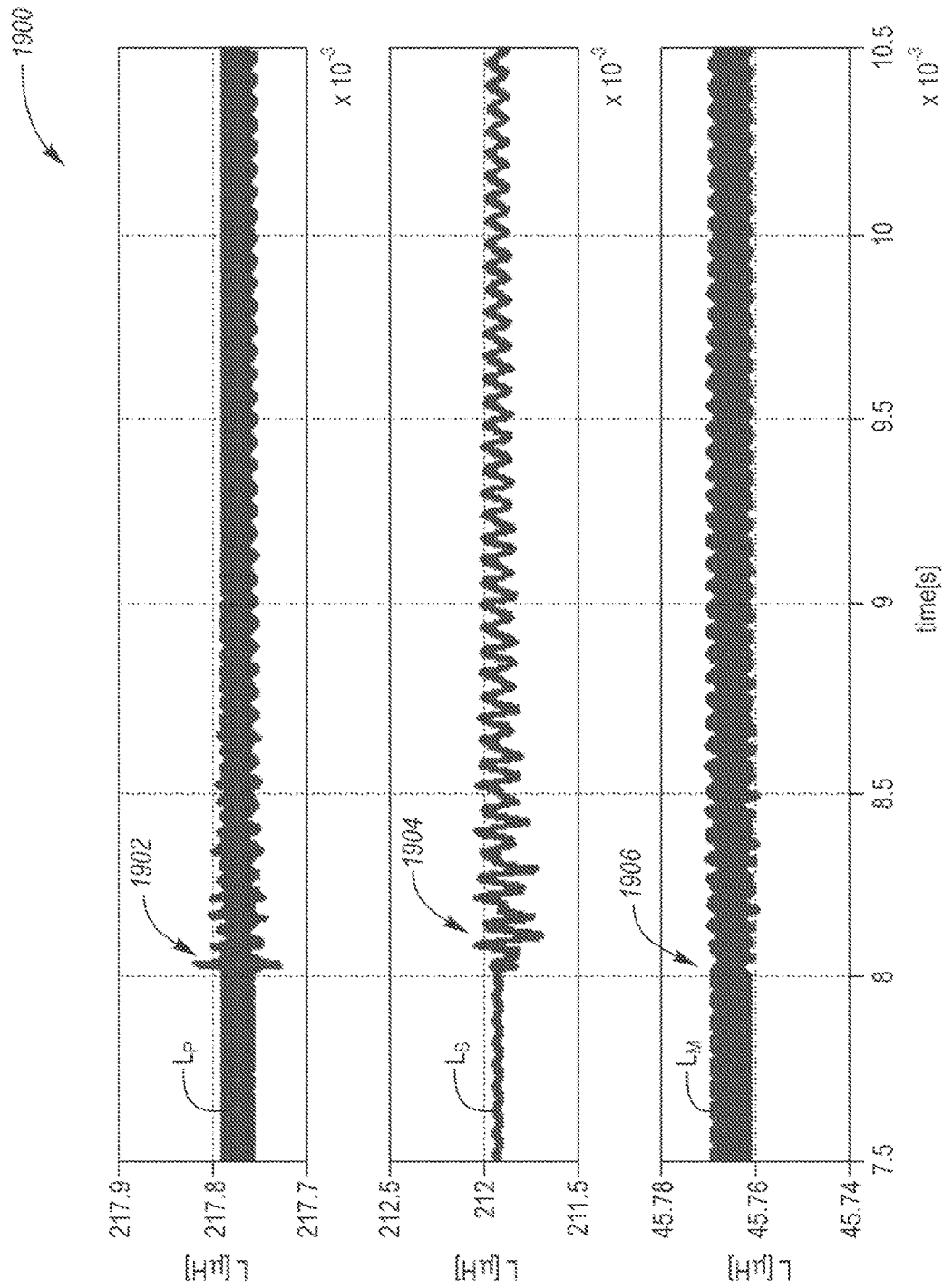
FIG. 19 is a graphical diagram of estimated parameters of the WPT system of FIG. 1 with respect to time.

FIGS. 17-19 are graphs illustrating simulation test data of the control systems 1500, 1600 when subjected to a voltage transient. The input voltage to the primary (external) matching network 184 (FIG. 5) is changed with a step function from 110V to 55V at time instant 8 ms.

FIG. 17 includes graphs illustrating the primary and secondary voltage measurements converted to the DQ reference frame, as generally referenced by numeral 1700. Curves 1702 and 1704 represent the $V_d$ and $V_q$ components of the primary side voltage measurement. And curves 1712 and 1714 represent the $V_d$ and $V_q$ components of the secondary side voltage measurement. FIG. 18 includes graphs 1800 illustrating the primary and secondary current measurements converted to the DQ reference frame. Curves 1802 and 1804 represent the $I_d$ and $I_q$ components of the primary side current measurement. And curves 1812 and 1814 represent the $I_d$ and $I_q$ components of the secondary side current measurement. Graphs 1700, 1800 illustrate the voltage transient at 8 ms.

FIG. 19 includes graphs 1900 illustrating the calculated coil parameters ($L_P$, $L_S$, $L_M$) during the same time frame as FIGS. 17-18. The graphs 1900 illustrate some noise in the inductance calculations in response to the voltage transient at 8 ms as referenced by numerals 1902, 1904 and 1906. The simulation confirms that the control systems 1500, 1600 are not affected by transients.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle comprising:
    a coil adapted to receive power wirelessly in single-phase form from an external coil;
    a sensor adapted to measure a characteristic of the power; and
    a controller programmed to estimate a parameter indicative of coil alignment using a three-phase representation of the power based on the characteristic, and adjust the power received by the coil based on the parameter.

2. The vehicle of claim 1 wherein the controller is further programmed to:
    generate a second phase representation of the received power shifted by 120 degrees;
    generate a third phase representation of the received power shifted by 240 degrees; and
    generate a complex vector based on the received power, the second phase representation and the third phase representation, wherein the three-phase representation of the power is based on the complex vector.

3. The vehicle of claim 2 wherein the controller is further programmed to convert the complex vector to a rotating direct-quadrature-zero (DQ) reference frame indicative of the three-phase representation of the power.

4. The vehicle of claim 1 wherein the controller is further programmed to generate a rotating direct-quadrature-zero (DQ) reference frame indicative of the three-phase representation of the power.

5. The vehicle of claim 4 wherein the controller is further programmed to:
    calculate at least one flux linkage using equations based on a DQ circuit model of the rotating DQ reference frame; and
    calculate the parameter indicative of coil alignment based on the flux linkage whereby the parameter is not influenced by system dynamics.

6. The vehicle of claim 1 wherein the vehicle further comprises an energy source connected to the coil and adapted to receive the power for charging thereof.

7. The vehicle of claim 1 wherein the characteristic of the power further comprises at least one of a voltage and a current received by at least one of the coil and the external coil.

8. The vehicle of claim 1 wherein the controller is further programmed to adjust at least one of a switching frequency and a phase shift angle of the power received by the coil based on the parameter.

9. The vehicle of claim 1 wherein the controller is further programmed to adjust the power received by the coil by providing a command to an external controller to adjust at least one of a switching frequency and a phase shift angle of the power provided to the external coil.

10. The vehicle of claim 1 wherein the parameter is indicative of at least one of a coil inductance, an external coil inductance and a mutual inductance of the coil and the external coil.

11. A power transfer system comprising:
    a coil adapted to receive power inductively from an external coil;
    an inverter coupled to the external coil; and
    a controller programmed to adjust at least one of a switching frequency and a phase shift angle of the inverter based on coil alignment estimated using a three-phase representation of the power.

12. The power transfer system of claim 11 further comprising:
    an external power source coupled to the external coil to provide the power, wherein the inverter is connected between the external power source and the external coil; and
    an external controller programmed to receive a command indicative of the at least one of the switching frequency and the phase shift angle from the controller and to control the inverter based on the command.

13. The power transfer system of claim 11 further comprising a battery electrically connected to the coil to store the power.

14. The power transfer system of claim 11 further comprising a sensor for measuring a characteristic of the power.

15. The power transfer system of claim 14 wherein the controller is further programmed to estimate a parameter indicative of the coil alignment based on the characteristic.

16. The power transfer system of claim 15 wherein the parameter is indicative of at least one of a coil inductance, an external coil inductance, and a mutual inductance of the coil and the external coil.

17. The power transfer system of claim 11 wherein the controller is further programmed to:
    generate a rotating direct-quadrature-zero (DQ) reference frame indicative of the three-phase representation of the power;
    calculate at least one flux linkage using equations based on the rotating DQ reference frame; and
    calculate a parameter indicative of the coil alignment based on the flux linkage.

18. A wireless power transfer (WPT) method comprising:
receiving power wirelessly from an external source through coupled coils;
measuring a characteristic of the power;
generating a three-phase representation of the power based on the measured characteristic;
estimating a parameter indicative of coil alignment using the three-phase representation; and
adjusting the power based on the parameter.

19. The WPT method of claim 18 wherein generating the three-phase representation of the power further comprises generating a rotating direct-quadrature-zero (DQ) reference frame based on the measured characteristic.

20. The WPT method of claim 19 further comprising:
calculating at least one flux linkage based on the rotating DQ reference frame; and
calculating the parameter indicative of the coil alignment based on the flux linkage.

* * * * *